US012313710B2

(12) United States Patent
Keerthivasan et al.

(10) Patent No.: US 12,313,710 B2
(45) Date of Patent: May 27, 2025

(54) B1+ MAPPING NEAR METALLIC HARDWARE

(71) Applicants: SIEMENS HEALTHINEERS AG, Forchheim (DE); NEW YORK UNIVERSITY, New York, NY (US)

(72) Inventors: Mahesh Bharath Keerthivasan, Tucson, AZ (US); Iman Khodarahmi, New York, NY (US)

(73) Assignees: SIEMENS HEALTHINEERS AG, Forchheim (DE); NEW YORK UNIVERSITY, New York, NY (US)

( * ) Notice: Subject to any disclaimer, the term of this patent is extended or adjusted under 35 U.S.C. 154(b) by 145 days.

(21) Appl. No.: 18/115,610

(22) Filed: Feb. 28, 2023

(65) Prior Publication Data
US 2023/0280422 A1    Sep. 7, 2023

Related U.S. Application Data

(60) Provisional application No. 63/268,713, filed on Mar. 1, 2022.

(51) Int. Cl.
*G01R 33/24* (2006.01)
*G01R 33/561* (2006.01)
*G01R 33/565* (2006.01)
*G01R 33/58* (2006.01)

(52) U.S. Cl.
CPC ....... *G01R 33/246* (2013.01); *G01R 33/5612* (2013.01); *G01R 33/56554* (2013.01); *G01R 33/5659* (2013.01); *G01R 33/586* (2013.01); *G01R 33/5617* (2013.01); *G01R 33/56536* (2013.01)

(58) Field of Classification Search
CPC ............. G01R 33/246; G01R 33/5612; G01R 33/56554; G01R 33/5659; G01R 33/586; G01R 33/5617; G01R 33/56536
See application file for complete search history.

(56) References Cited

U.S. PATENT DOCUMENTS

2020/0341096 A1*  10/2020  Garwood ........... G01R 33/5616

FOREIGN PATENT DOCUMENTS

EP    3451009 A1 *  3/2019 ............. A61B 5/055

OTHER PUBLICATIONS

Bachschmidt, et al., "Polarized multichannel transmit MRI to reduce shading near metal implants," Magnetic Resonance in Medicine 75(1), pp. 217-226 (2016).
Ben Eliezer, et al., "Rapid and accurate T2 mapping from multi-spin-echo data using Bloch-simulation-based reconstruction," Magnetic Resonance in Medicine 73(2), pp. 809-817 (2015).

(Continued)

*Primary Examiner* — Rishi R Patel
(74) *Attorney, Agent, or Firm* — Foley & Lardner LLP (57) ABSTRACT

A method can include obtaining a scaling factor for a location proximate a metallic object by optimizing a function of an acquired dataset and a simulated dataset. The simulated dataset can include a first signal from a first pulse having a first excitation flip angle and a first refocusing flip angle. The simulated dataset can include a second signal from a second pulse having a second excitation flip angle and a second refocusing flip angle.

18 Claims, 6 Drawing Sheets

(56) References Cited

OTHER PUBLICATIONS

Chung, et al., "Rapid B1 mapping using a preconditioning RF pulse with TurboFLASH readout," Magnetic Resonance in Medicine 64(2), pp. 439-446 (2010).
Keerthivasan, et al., "Abdominal T2-Weighted Imaging and T2 Mapping Using a Variable Flip Angle Radial Turbo Spin-Echo Technique," Journal of Magnetic Resonance Imaging 55(1), pp. 289-300 (2022).
Levine, et al., "3D Cartesian MRI with compressed sensing and variable view sharing using complementary poisson-disc sampling," Magnetic Resonance in Medicine 77(5), pp. 1774-1785 (2017).
Liu, et al., "Fast and accurate modeling of transient-state, gradient-spoiled sequences by recurrent neural networks," NMR in Biomedicine 34(7):e4527, 18 pages (2021).
Lu, et al., "SEMAC: Slice encoding for metal artifact correction in MRI," Magnetic Resonance in Medicine 62(1), pp. 66-76 (2009).
Monu, et al., "B1 Mapping Near Metallic Implants," Proceedings of the International Society for Magnetic Resonance in Medicine 19, p. 3175 (2011).

\* cited by examiner

B1+ MAPPING NEAR METALLIC HARDWARE

CROSS-REFERENCE TO RELATED APPLICATIONS

This application claims priority to U.S. Provisional Patent App. No. 63/268,713, filed Mar. 1, 2022, the contents of which is incorporated herein by reference in its entirety.

TECHNICAL FIELD

The present disclosure relates generally to $B_1^+$ mapping near metallic hardware.

BACKGROUND

Inhomogeneity of the transmit $B_1^+$ field can cause spatial variation of flip angles.

SUMMARY $B_1^+$ mapping near metallic hardware may fail due to inhomogeneity of the transmit $B_1^+$ field. The apparatuses, systems, and methods described herein can provide for $B_1^+$ mapping near metallic hardware.

At least one aspect is directed to a method. The method can include obtaining a scaling factor for a location proximate a metallic object by optimizing a function of an acquired dataset and a simulated dataset. The simulated dataset can include a first signal from a first pulse having a first excitation flip angle and a first refocusing flip angle. The simulated dataset can include a second signal from a second pulse having a second excitation flip angle and a second refocusing flip angle.

At least one aspect is directed to a magnetic resonance imaging system. The magnetic resonance imaging system can include at least one processor. The magnetic resonance imaging system can include a memory with computer code instructions stored thereon. The computer code instructions, when executed by the at least one processor, can cause the at least one processor to obtain a scaling factor for a location proximate a metallic object by optimizing a function of an acquired dataset and a simulated dataset. The simulated dataset can include a first signal from a first pulse having a first excitation flip angle and a first refocusing flip angle. The simulated dataset can include a second signal from a second pulse having a second excitation flip angle and a second refocusing flip angle.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. The foregoing information and the following detailed description and drawings include illustrative examples and should not be considered as limiting.

BRIEF DESCRIPTION OF THE FIGURES

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Following below are more detailed descriptions of various concepts related to, and implementations of, methods, apparatuses, and systems of $B_1^+$ mapping near metallic hardware. The various concepts introduced above and discussed in greater detail below may be implemented in any of numerous ways.

Inhomogeneity of the transmit $B_1^+$ field can cause spatial variation of flip angles (FAs). Mapping of such spatial distribution can have applications in $B_1$-shimming, quantitative magnetic resonance imaging (MM), and transmit coil quality control. The majority of available $B_1^+$ mapping techniques can utilize gradient-echo imaging and, hence, will fail in the presence of metallic implants due to susceptibility-induced phase distortions. In addition, successful $B_1^+$ mapping near metallic implants can incorporate techniques such as Slice Encoding for Metal Artifact Correction (SEMAC) to reduce $B_0$ artifacts. A technique combining SEMAC and dual-angle methods (DAM) to estimate $B_1^+$ in the presence of metal may not account for the contribution of stimulated echoes in a turbo-spin echo (TSE) acquisition, which may negatively affect the outcomes.

The present disclosure is directed to systems and methods of $B_1^+$ mapping near metallic hardware (e.g., implants). The technical solution described herein can include a $B_1^+$ quantification technique using turbo-spin echo or SEMAC acquisitions to decrease metal-related susceptibility artifacts while resolving $B_1^+$ values from signal variations at various sets of excitation and refocusing flip angles. Apriori knowledge of signal evolution can be obtained by simulating the Bloch equations at each $B_1^+$ value. Phantom validation showed promising results, particularly at areas close to the metal surface, which are invisible with other mapping techniques. The solutions can include a TSE-based method of $B_1^+$ quantification near metallic implants, which can be combined with SEMAC.

Theory.

$B_1^+$ field variations can affect a TSE pulse sequence by proportionally scaling the excitation and refocusing (Ex-Ref) radiofrequency (RF) pulse flip angles. In the presence of a $B_1^+$ scale factor (e.g., scaling factor) of $b_1$ ($b_1$=actual $B_1^+$/nominal $B_1^+$), the signal intensity can be expressed as Equation 1:

$$S(b_1) = f(b_1 \cdot \theta(z), b_1 \cdot \varphi(z)) \quad (1)$$

where $\theta(z)$ and $\varphi(z)$ represent excitation and refocusing radiofrequency profiles, respectively, and $f(\cdot)$ is the slice-resolved Bloch model. For different sets of excitation and refocusing flip angles, $b_1$ can be obtained by solving the optimization problem shown in Equation 2:

$$\min_{b_1} \sum_i^n \left\| f(b_1 \cdot \theta_i(z), b_1 \cdot \varphi_i(z)) - \hat{S}(\theta_i, \varphi_i) \right\|_2 \quad (2)$$

with $\hat{S}(\theta_i, \varphi_i)$ being the pixel signal obtained by the $i^{th}$ set of excitation and refocusing flip angles.

To accelerate the acquisition, spatiotemporal undersampling can be used in $k_y$-$k_z$-FA set dimension using variable density sampling schemes such as complementary Poisson disc. By sampling the center of $k_y$-$k_z$ space for each set of excitation and refocusing flip angles, the $B_1^+$ sensitive contrast can be encoded. The undersampled data can be reconstructed using a model-based algorithm formulated as Equation 3:

$$\hat{M} = \operatorname*{argmin}_{M} \left\| \sum_i^N E_i \psi M - K_i \right\|_2^2 + \lambda R(M) \quad (3)$$

where E is the Fourier encoding operator that also accounts for SEMAC encoding, K is the acquired k-space data, $\psi$ is a L-dimensional principal component subspace basis such that L<<ETL and M are the principal component coefficients. R is a locally low-rank regularization term with multiplicative factor $\lambda$. The subspace basis can be generated using a Bloch equation-based model of the TSE sequence. The reconstruction can be implemented using conjugate gradient descent or alternating direction method of multipliers algorithms.

Simulations.

The magnetization evolution for different excitation and refocusing flip angles during TSE acquisitions can be modeled by simulating the spatiotemporal propagation of spins according to Bloch equations. The exact pulse sequence scheme and parameters can be used to simulate the signal evaluation while slice profiles can be resolved by solving the Bloch equations. A database of the signal intensity for various sets of excitation and refocusing flip angles and $b_1$ can be generated.

Model Validation.

The model accuracy for different sets of excitation and refocusing flip angles (n=8) was tested on a clinical 3T MM system (MAGNETOM Prisma; Siemens Healthcare GmbH, Erlangen, Germany) by placing a gel containing cylindrical tube at the iso-center of the magnet. Iso-center placement of the tube and its small diameter ensured $B_1^+$ homogeneity ($b_1$=1). To measure the magnetization evolution at each excitation and refocusing flip angle, the phase-encoding gradients were switched off, and consequently, no spatial in-plane encoding was applied.

Figure 1:
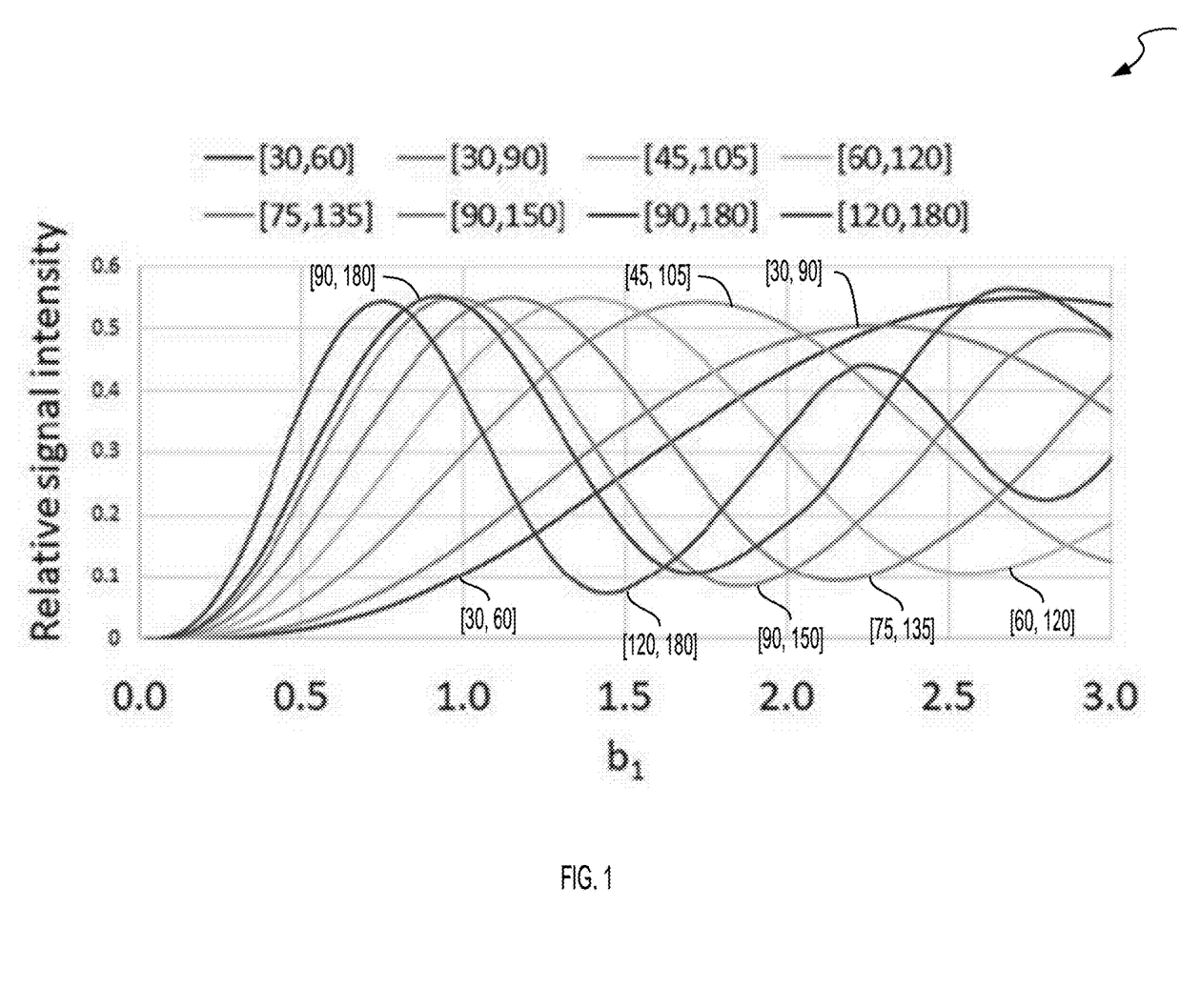
FIG. 1 illustrates a plot of Bloch simulated signal intensity as a function of $b_1$ for various sets of excitation and refocusing flip angles, according to an example implementation.

FIG. 1 illustrates a plot 100 of Bloch simulated signal intensity as a function of $b_1$ for various sets of excitation and refocusing flip angles. Simulated signal for various excitation and refocusing flip angle sets as a function of $b_1$ is shown in FIG. 1. As seen, lower excitation and refocusing flip angle sets (e.g., 30°-60°, 30°-90° are more sensitive to higher $b_1$ values, whereas higher sets (e.g., 120°-180°, 90°-180° are more sensitive to lower $b_1$.

Figure 2:
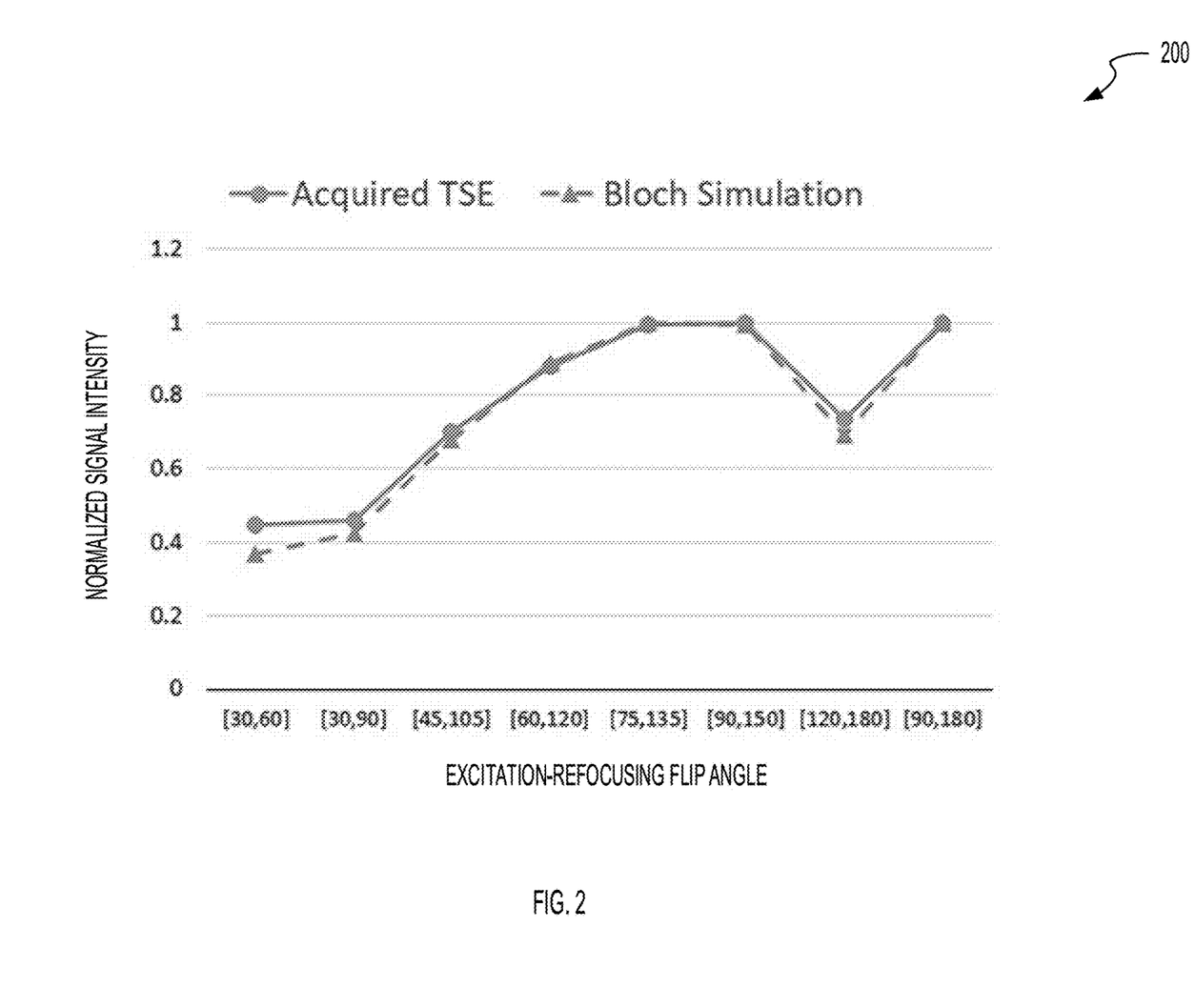
FIG. 2 illustrates a plot of experimental and Bloch simulated signal intensity of various sets of excitation and refocusing flip angles at $b_1=1$, according to an example implementation.

FIG. 2 illustrates a plot 200 of experimental and Bloch simulated signal intensity of various sets of excitation and refocusing flip angles at $b_1$=1. The Bloch model showed promising performance against the experimental data obtained with TSE sequence at $b_1$=1 (FIG. 2), with a maximum of 8% signal underestimation observed at excitation and refocusing flip angles of 30° and 60°, respectively (e.g., 30°-60°).

The magnetic resonance imaging (MM) system of the present disclosure can include at least one processor. The MM system can include a memory, with computer code instructions stored thereon. The computer code instructions, when executed by the at least one processor, can cause the at least one processor to obtain a scaling factor (e.g., scale factor, $b_1$). The scaling factor can include actual $B_1^+$/nominal $B_1^+$. The at least one processor can obtain the scaling factor for a location proximate a metallic object (e.g., implant, medical implants, metal implant, metal object, metallic hardware, metal hardware, etc.). For example, the metallic object can be made from iron (e.g., stainless steel), cobalt, chromium, titanium, magnesium, or tantalum. The metallic object can include a hip implant (e.g., hip arthroplasty implant).

The at least one processor can obtain the scaling factor for the location proximate the metallic object by optimizing a function of an acquired dataset and a simulated dataset. The function of the acquired dataset and the simulated dataset can include the function shown in Equation 2. The acquired dataset can include the pixel signal represented by $\hat{S}(\theta_i, \varphi_i)$ in Equation 2. The acquired dataset can be generated according to a slice encoding for metal artifact correction (SEMAC) method. The acquired dataset can be generated according to turbo-spin echo imaging. The simulated dataset can include the slice-resolved Bloch model represented by $f(\cdot)$ in Equation 2.

The simulated dataset can include one or more signals from one or more pulses having one or more flip angles. For example, the simulated dataset can include a first signal from a first pulse having a first excitation flip angle (e.g., $\theta$) and a first refocusing flip angle (e.g., $\varphi$). The simulated dataset can include a second signal from a second pulse having a second excitation flip angle and a second refocusing flip angle. The first signal can be the same as or different from the second signal. The first pulse can be the same as or different from the second pulse. The first excitation flip angle can be the same as or different from the second excitation flip angle. The first excitation flip angle can be in a range of 30° to 120°, inclusive. For example, the first excitation flip angle can include 30°, 45°, 60°, 75°, 90°, or 120°. The first excitation flip angle can be less than 30° or greater than 120°. The second excitation flip angle can be in a range of 30° to 120°, inclusive. For example, the second excitation flip angle can include 30°, 45°, 60°, 75°, 90°, or 120°. The second excitation flip angle can be less than 30° or greater than 120°. The first refocusing flip angle can be the same as or different from the second refocusing flip angle. The first refocusing flip angle can be in a range of 60° to 180°, inclusive. For example, the first refocusing flip angle can include 60°, 90°, 105°, 120°, 135°, 150°, or 180°. The first refocusing flip angle can be less than 60° or greater than 180°. The second refocusing flip angle can be in a range of 60° to 180°, inclusive. For example, the second refocusing flip angle can include 60°, 90°, 105°, 120°, 135°, 150°, or 180°. The second refocusing flip angle can be less than 60° or greater than 180°. The first excitation flip angle can be 30° and the first refocusing flip angle can be 90°. The second excitation flip angle can be 60° and the second refocusing flip angle can be 120°.

The simulated dataset can include a third signal from a third pulse having a third excitation flip angle and a third refocusing flip angle. The third signal can be the same as or different from the first signal. The third signal can be the same as or different from the second signal. The third pulse can be the same as or different from the first pulse. The third pulse can be the same as or different from the second pulse. The third excitation flip angle can be the same as or different from the first excitation flip angle. The third excitation flip angle can be the same as or different from the second excitation flip angle. The third excitation flip angle can be in a range of 30° to 120°, inclusive. For example, the third excitation flip angle can include 30°, 45°, 60°, 75°, 90°, or 120°. The third excitation flip angle can be less than 30° or greater than 120°. The third refocusing flip angle can be the same as or different from the first refocusing flip angle. The third refocusing flip angle can be the same as or different from the second refocusing flip angle. The third refocusing flip angle can be in a range of 60° to 180°, inclusive. For example, the third refocusing flip angle can include 60°, 90°, 105°, 120°, 135°, 150°, or 180°. The third refocusing flip angle can be less than 60° or greater than 180°. The third excitation flip angle can be 90° and the third refocusing flip angle can be 150°.

The simulated dataset can include a fourth signal from a fourth pulse having a fourth excitation flip angle and a fourth refocusing flip angle. The fourth signal can be the same as or different from the first signal. The fourth signal can be the same as or different from the second signal. The fourth signal can be the same as or different from the third signal. The fourth pulse can be the same as or different from the first pulse. The fourth pulse can be the same as or different from the second pulse. The fourth pulse can be the same as or different from the third pulse. The fourth excitation flip angle can be the same as or different from the first excitation flip angle. The fourth excitation flip angle can be the same as or different from the second excitation flip angle. The fourth excitation flip angle can be the same as or different from the third excitation flip angle. The fourth excitation flip angle can be in a range of 30° to 120°, inclusive. For example, the fourth excitation flip angle can include 30°, 45°, 60°, 75°, 90°, or 120°. The fourth excitation flip angle can be less than 30° or greater than 120°. The fourth refocusing flip angle can be the same as or different from the first refocusing flip angle. The fourth refocusing flip angle can be the same as or different from the second refocusing flip angle. The fourth refocusing flip angle can be the same as or different from the third refocusing flip angle. The fourth refocusing flip angle can be in a range of 60° to 180°, inclusive. For example, the fourth refocusing flip angle can include 60°, 90°, 105°, 120°, 135°, 150°, or 180°. The fourth refocusing flip angle can be less than 60° or greater than 180°. The fourth excitation flip angle can be 30° and the fourth refocusing flip angle can be 90°.

The simulated dataset can include a fifth signal from a fifth pulse having a fifth excitation flip angle and a fifth refocusing flip angle. The fifth signal can be the same as or different from the first signal. The fifth signal can be the same as or different from the second signal. The fifth signal can be the same as or different from the third signal. The fifth signal can be the same as or different from the fourth signal. The fifth pulse can be the same as or different from the first pulse. The fifth pulse can be the same as or different from the second pulse. The fifth pulse can be the same as or different from the third pulse. The fifth pulse can be the same as or different from the fourth pulse. The fifth excitation flip angle can be the same as or different from the first excitation flip angle. The fifth excitation flip angle can be the same as or different from the second excitation flip angle. The fifth excitation flip angle can be the same as or different from the third excitation flip angle. The fifth excitation flip angle can be the same as or different from the fourth excitation flip angle. The fifth excitation flip angle can be in a range of 30° to 120°, inclusive. For example, the fifth excitation flip angle can include 30°, 45°, 60°, 75°, 90°, or 120°. The fifth excitation flip angle can be less than 30° or greater than 120°. The fifth refocusing flip angle can be the same as or different from the first refocusing flip angle. The fifth refocusing flip angle can be the same as or different from the second refocusing flip angle. The fifth refocusing flip angle can be the same as or different from the third refocusing flip angle. The fifth refocusing flip angle can be the same as or different from the fourth refocusing flip angle. The fifth refocusing flip angle can be in a range of 60° to 180°, inclusive. For example, the fifth refocusing flip angle can include 60°, 90°, 105°, 120°, 135°, 150°, or 180°. The fifth refocusing flip angle can be less than 60° or greater than 180°. The fifth excitation flip angle can be 45° and the fifth refocusing flip angle can be 105°.

The simulated dataset can include a sixth signal from a sixth pulse having a sixth excitation flip angle and a sixth refocusing flip angle. The sixth signal can be the same as or different from the first signal. The sixth signal can be the same as or different from the second signal. The sixth signal can be the same as or different from the third signal. The sixth signal can be the same as or different from the fourth signal. The sixth signal can be the same as or different from the fifth signal. The sixth pulse can be the same as or different from the first pulse. The sixth pulse can be the same as or different from the second pulse. The sixth pulse can be the same as or different from the third pulse. The sixth pulse can be the same as or different from the fourth pulse. The sixth pulse can be the same as or different from the fifth pulse. The sixth excitation flip angle can be the same as or different from the first excitation flip angle. The sixth excitation flip angle can be the same as or different from the second excitation flip angle. The sixth excitation flip angle can be the same as or different from the third excitation flip angle. The sixth excitation flip angle can be the same as or different from the fourth excitation flip angle. The sixth excitation flip angle can be the same as or different from the fifth excitation flip angle. The sixth excitation flip angle can be in a range of 30° to 120°, inclusive. For example, the sixth excitation flip angle can include 30°, 45°, 60°, 75°, 90°, or 120°. The sixth excitation flip angle can be less than 30° or greater than 120°. The sixth refocusing flip angle can be the same as or different from the first refocusing flip angle. The sixth refocusing flip angle can be the same as or different from the second refocusing flip angle. The sixth refocusing flip angle can be the same as or different from the third refocusing flip angle. The sixth refocusing flip angle can be the same as or different from the fourth refocusing flip angle. The sixth refocusing flip angle can be the same as or different from the fifth refocusing flip angle. The sixth refocusing flip angle can be in a range of 60° to 180°, inclusive. For example, the sixth refocusing flip angle can include 60°, 90°, 105°, 120°, 135°, 150°, or 180°. The sixth refocusing flip angle can be less than 60° or greater than 180°. The sixth excitation flip angle can be 120° and the sixth refocusing flip angle can be 180°.

The scaling factor can include a first scaling factor. The location can include a first location. The at least one processor can obtain a second scaling factor for a second location proximate the metallic object by optimizing the function of the acquired dataset and the simulated dataset. The first scaling factor can be the same as or different from the second scaling factor. The first location can be the same as or different from the second location. The locations (e.g., first location, second location, etc.) can include locations in a $b_1$ map or a $B_1^+$ map.

The at least one processor can sample a first center of $k_y$-$k_z$ space for the first pulse. The at least one processor can sample a second center of $k_y$-$k_z$ space for the second pulse. This can include spatiotemporal undersampling in $k_y$-$k_z$-FA set dimension using variable density sampling schemes such as complementary Poisson disc. Sampling a first center of $k_y$-$k_z$ space for the first pulse and sampling a second center of $k_y$-$k_z$ space for the second pulse can encode the $B_1^+$ sensitive contrast. The undersampled data can be reconstructed using the model-based algorithm shown in Equation 3.

Hip Arthroplasty MRI.

Ceramic-on-metal titanium (Ti) and metal-on-metal cobalt-chromium ("CoCr") hip arthroplasty implants embedded in ASTM get medium (T1=1000 ms, T2=60 ms) were imaged with high transmit-receiver bandwidth TSE and SEMAC pulse sequences, respectively. Sequence parameters included TR/TE=3000/24 ms, slice thickness=3 mm, and SEMAC steps: 16. The signal intensities of these acquisitions were compared against the simulated database to solve the minimization problem shown in Equation 2. For comparison purposes, $b_1$ maps were also obtained using the TurboFLASH method, which includes a TurboFLASH sequence equipped with a preceding RF pulse for magnetization preparation.

Figure 3A:
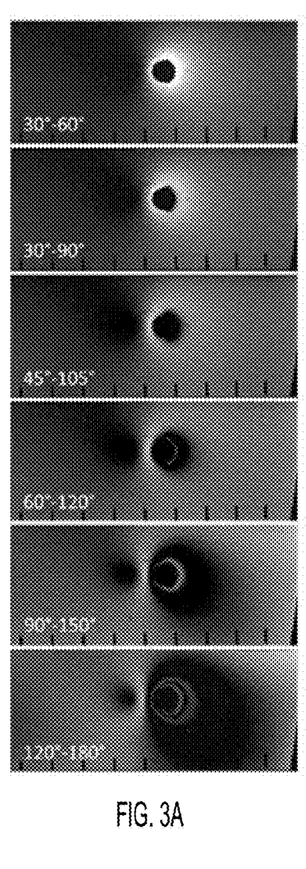
FIG. 3A illustrates high transmit-receive bandwidth turbo-spin echo images acquired at various excitation and refocusing flip angles, according to an example implementation.
Figure 3B:
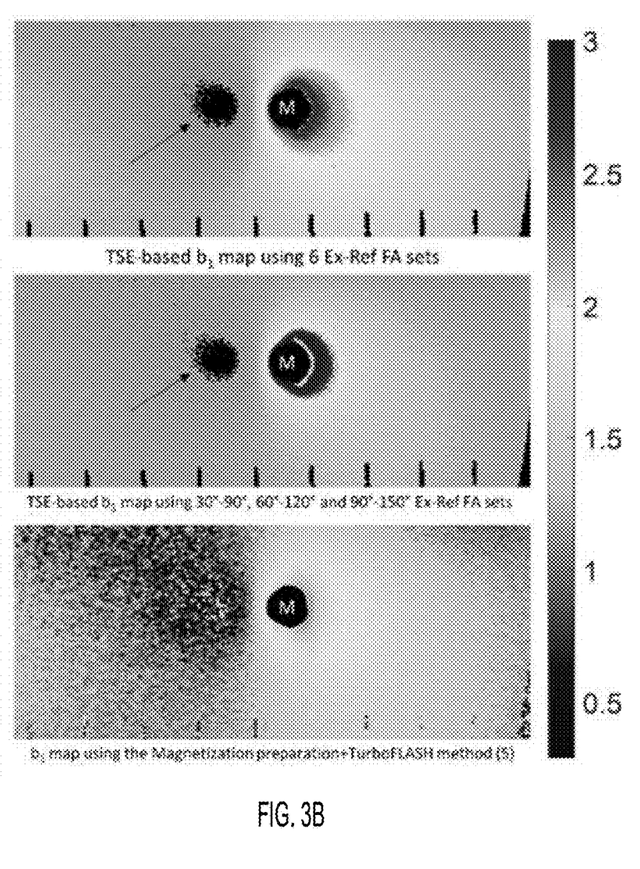
FIG. 3B illustrates estimated $b_1$ maps, according to an example implementation.

Axial images of the Ti implant along the femoral stem acquired with various excitation and refocusing flip angles sets and the estimated $b_1$ map are shown in FIGS. 3A-3B. FIG. 3A illustrates high transmit-receive bandwidth turbo-spin echo images acquired at various excitation and refocusing flip angles. The six images, from top to bottom, show the turbo-spin echo images acquired at excitation and refocusing flip angles of 30° and 60°, 30° and 90°, 45° and 105°, 60° and 120°, 90° and 150°, 120° and 180°.

The top image of FIG. 3B illustrates estimated $b_1$ maps with six excitation and refocusing flip angles generated using the systems and methods of the present disclosure. The six excitation and refocusing flip angles include 30° and 60°, 30° and 90°, 45° and 105°, 60° and 120°, 90° and 150°, and 120° and 180°. Near the implant (M) surface, there were higher $b_1$ values than further away from the implant surface. The middle image of FIG. 3B illustrates estimated $b_1$ maps with three excitation and refocusing flip angles generated using the systems and methods of the present disclosure. The three excitation and refocusing flip angles include 30° and 90°, 60° and 120°, and 90° and 150°. The at least one processor can obtain a $B_1^+$ map for a region proximate the metallic object. For example, the at least one processor can obtain the $B_1^+$ map from the estimated $b_1$ maps. The at least one processor can estimate a spatial distribution of a $B_1^+$ field for a region proximate the metallic object. The bottom image of FIG. 3B illustrates estimated $b_1$ maps generated with the TurboFLASH method. Arrows indicate areas of shading where $b_1$ cannot be estimated due to lack of signal. "M" indicates the metal implant.

Higher $b_1$ values were noted near the implant surface, which is in alignment with numerical simulations. Such high values were not detected with the TurboFLASH method due to dependencies between the preparation RF pulse and the $b_1$ dynamic range in this method. Three excitation and refocusing flip angle sets was capable of providing the $b_1$ maps except for a thin rind (e.g., semicircle, ridge) at the metal surface.

Figure 4A:
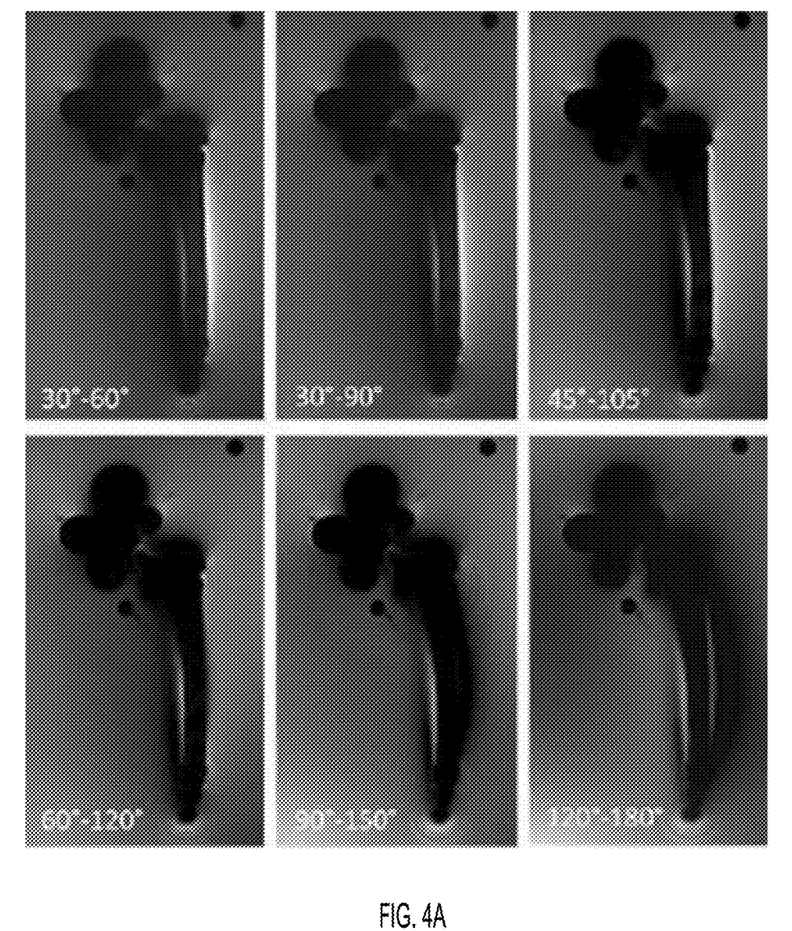
FIG. 4A illustrates SEMAC images acquired at various excitation and refocusing flip angles, according to an example implementation.
Figure 4B:
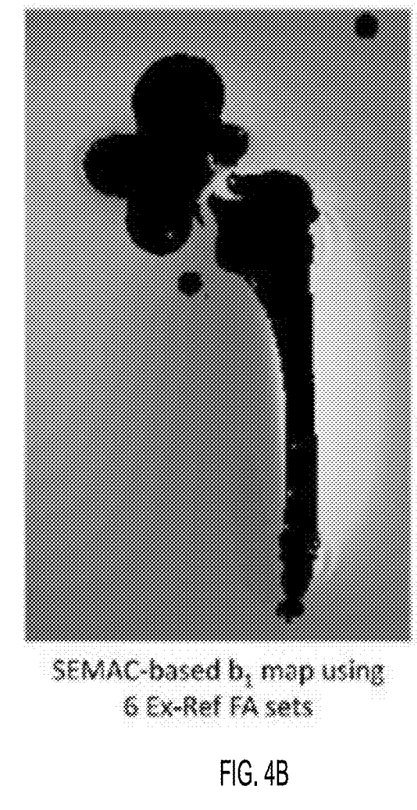
FIG. 4B illustrates an estimated $b_1$ map using six excitation and refocusing flip angles sets, according to an example implementation.
Figure 4C:
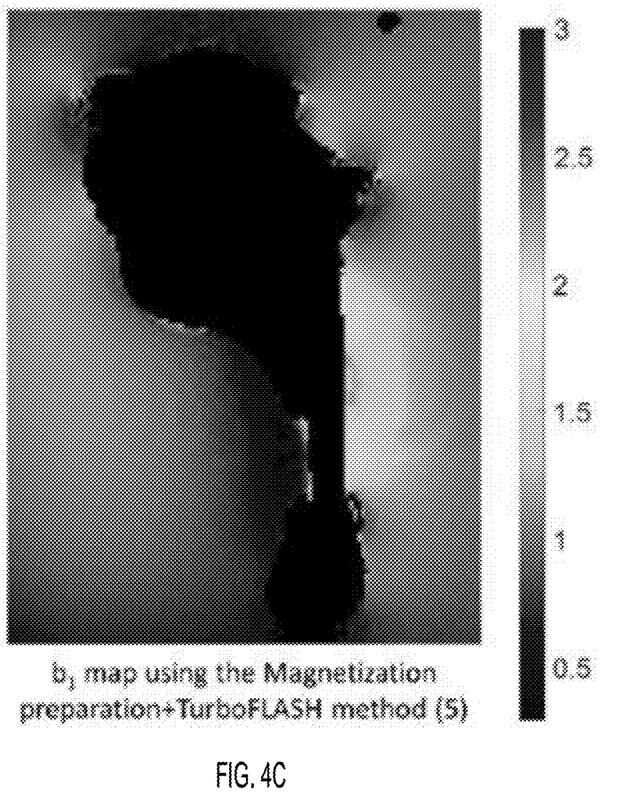
FIG. 4C illustrates an estimated $b_1$ map using the Turbo-FLASH method.

FIG. 4A illustrates SEMAC images acquired at various excitation and refocusing flip angles. FIG. 4B illustrates an estimated $b_1$ map using six excitation and refocusing flip angles sets. FIG. 4B shows the $b_1$ distribution in the coronal plane of the CoCr implant acquired using SEMAC images and six excitation and refocusing flip angles sets. FIG. 4C shows the $b_1$ distribution in the coronal plane of the CoCr implant acquired with the TurboFLASH technique. Dark regions represent the implant and associated susceptibility artifacts. Due to high susceptibility artifacts of the CoCr, $b_1$ quantification may only be possible with the implementation of SEMAC.

The systems and methods of the present disclosure can estimate the spatial distribution of the $B_1^+$ field surrounding metallic implants by applying various excitation-refocusing schemes while using TSE or SEMAC acquisitions for metal artifact reduction. Promising results were obtained, particularly at areas close to the metal surface, which are invisible with other mapping techniques.

Figure 5:
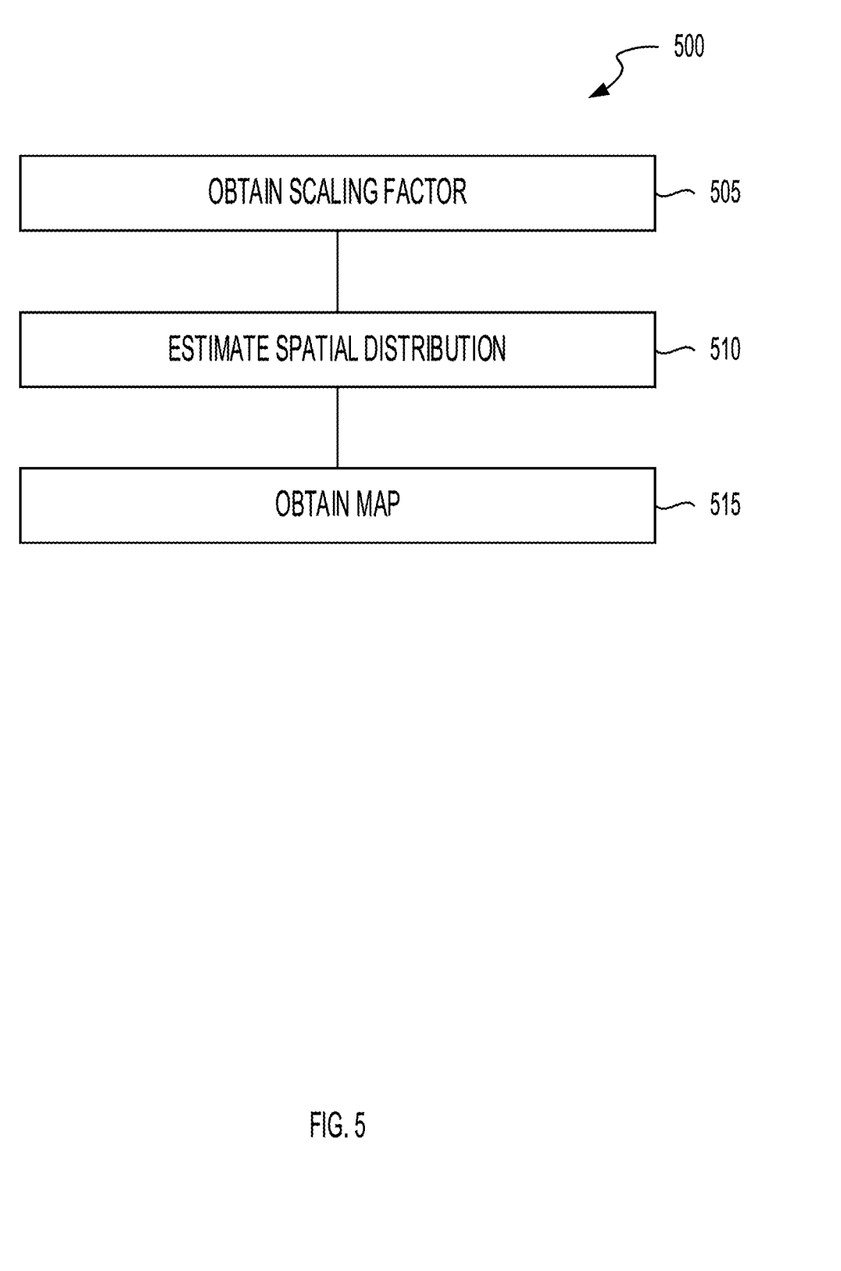
FIG. 5 illustrates a perspective view of a method of $B_1^+$ mapping, according to an example implementation.

FIG. 5 illustrates a perspective view of a method 500 of $B_1^+$ mapping. In brief summary, the method 500 can include obtaining a scaling factor (BLOCK 505). The method 500 can include estimating a spatial distribution (BLOCK 510). The method 500 can include obtaining a map (BLOCK 515).

The method 500 can include obtaining (e.g., determining, calculating, finding, etc.) the scaling factor (BLOCK 505). For example, the method 500 can include obtaining the scaling factor for the location proximate the metallic object. The scaling factor can include $b_1$. The scaling factor can include actual $B_1^+$/nominal $B_1^+$. The metallic object can include the implant. The method 500 can include obtaining the scaling factor for the location proximate the metallic object by optimizing (e.g., minimizing, maximizing) the function of the acquired dataset and the simulated dataset. For example, obtaining the scaling factor by optimizing the function of the acquired dataset and the simulated dataset can include obtaining the value of the scaling factor (e.g., $b_1$) that minimizes the function of the acquired dataset and the simulated dataset. Obtaining the scaling factor by optimizing the function of the acquired dataset and the simulated dataset can include obtaining the value of the scaling factor that minimizes a difference between the acquired dataset and the simulated dataset. Obtaining the scaling factor by optimizing the function of the acquired dataset and the simulated dataset can include obtaining the value of the scaling factor that maximizes the function of the acquired dataset and the simulated dataset. Obtaining the scaling factor by optimizing the function of the acquired dataset and the simulated dataset can include obtaining the value of the scaling factor that maximizes a difference between the acquired dataset and the simulated dataset. The function of the acquired dataset and the simulated dataset can include the function shown in Equation 2. The acquired dataset can include the pixel signal represented by $S(\theta_i, \varphi_i)$ in Equation 2. The acquired dataset can be generated according to the slice encoding for metal artifact correction (SEMAC) method. The acquired dataset can be generated according to turbo-spin echo imaging. The simulated dataset can include the slice-resolved Bloch model represented by $f(\cdot)$ in Equation 2. The simulated dataset can include the first signal from the first pulse having the first excitation flip angle and the first refocusing flip angle. The simulated dataset can include the second signal from the second pulse having the second excitation flip angle and the second refocusing flip angle. The first pulse can be different from the second pulse. The simulated dataset can include the third signal from the third pulse having the third excitation flip angle and the third refocusing flip angle. The first excitation flip angle can be 30° and the first refocusing flip angle can be 90°, the second excitation flip angle can be 60° and the second refocusing flip angle can be 120°, and the third excitation flip angle can be 90° and the third refocusing flip angle can be 150°. The simulated dataset can include the fourth signal from the fourth pulse having the fourth excitation flip angle and the fourth refocusing flip angle.

The scaling factor can include the first scaling factor. The location can include the first location. The at least one processor can obtain the second scaling factor for the second location proximate the metallic object by optimizing the function of the acquired dataset and the simulated dataset. The first scaling factor can be the same as or different from the second scaling factor. The first location can be the same as or different from the second location. The locations (e.g., first location, second location, etc.) can include locations of the $b_1$ map or the $B_1^+$ map.

The method 500 can include estimating the spatial distribution (BLOCK 510). For example, the method 500 can include estimating the spatial distribution of the $B_1^+$ field for the region proximate the metallic object. The method 500 can include sampling the first center of $k_y$-$k_z$ space for the first pulse. The method 500 can include sampling the second center of $k_y$-$k_z$ space for the second pulse.

The method 500 can include obtaining (e.g., determining, calculating, producing, etc.) the map (BLOCK 515). For example, the method 500 can include obtaining the $B_1^+$ map for the region proximate the metallic object. The method 500 can include obtaining the $b_1$ map for the region proximate the metallic object.

Definitions

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

Any references herein to the positions of elements (e.g., "top," "bottom," "above," "below") are merely used to describe the orientation of various elements in the figures. It should be noted that the orientation of various elements may differ according to other exemplary embodiments, and that such variations are intended to be encompassed by the present disclosure.

Various embodiments are described in the general context of method steps, which may be implemented in one embodiment by a program product including computer-executable instructions, such as program code, executed by computers in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present invention could be accomplished with standard programming techniques with rule based logic and other logic to accomplish the various database searching steps, correlation steps, comparison steps and decision steps. It should also be noted that the words "component" and "module," as used herein and in the claims, are intended to encompass implementations using one or more lines of software code, and/or hardware implementations, and/or equipment for receiving manual inputs.

As used herein, the singular forms "a," "an," and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method, comprising:
    obtaining a scaling factor corresponding to a ratio of actual $B_1^+$ to nominal $B_1^+$ for a location proximate a metallic object by minimizing a function of an acquired dataset and a simulated dataset; and
    obtaining a $B_1^+$ map for a region proximate the metallic object based on the scaling factor;
    wherein the simulated dataset comprises:
        a first signal from a first pulse having a first excitation flip angle and a first refocusing flip angle; and
        a second signal from a second pulse having a second excitation flip angle and a second refocusing flip angle.

2. The method of claim 1, wherein the acquired dataset is generated according to a slice encoding for metal artifact correction (SEMAC) method.

3. The method of claim 1, further comprising:
    sampling a first center of $k_y$-$k_z$ space for the first pulse; and
    sampling a second center of $k_y$-$k_z$ space for the second pulse.

4. The method of claim 1, wherein the scaling factor is a first scaling factor and the location is a first location, the method further comprising:
    obtaining a second scaling factor for a second location proximate the metallic object by minimizing the function of the acquired dataset and the simulated dataset.

5. The method of claim 1, wherein the simulated dataset comprises a third signal from a third pulse having a third excitation flip angle and a third refocusing flip angle.

6. The method of claim 1, wherein:
    the simulated dataset comprises a third signal from a third pulse having a third excitation flip angle and a third refocusing flip angle; and
    the first excitation flip angle is 30° and the first refocusing flip angle is 90°, the second excitation flip angle is 60° and the second refocusing flip angle is 120°, and the third excitation flip angle is 90° and the third refocusing flip angle is 150°.

7. The method of claim 1, wherein:
    the simulated dataset comprises:
        a third signal from a third pulse having a third excitation flip angle and a third refocusing flip angle; and
        a fourth signal from a fourth pulse having a fourth excitation flip angle and a fourth refocusing flip angle.

8. The method of claim 1, wherein the first pulse is different from the second pulse.

9. The method of claim 1, wherein the metallic object is an implant.

10. The method of claim 1, wherein the acquired dataset is generated according to turbo-spin echo imaging.

11. The method of claim 1, further comprising:
    estimating a spatial distribution of a $B_1^+$ field for the region proximate the metallic object.

12. A magnetic resonance imaging system, comprising:
    at least one processor; and
    a memory, with computer code instructions stored thereon, the computer code instructions, when executed by the at least one processor, cause the at least one processor to:
        obtain a scaling factor corresponding to a ratio of actual $B_1^+$ to nominal $B_1^+$ for a location proximate a metallic object by minimizing a function of an acquired dataset and a simulated dataset; and
        obtain a $B_1^+$ map for a region proximate the metallic object based on the scaling factor;

wherein the simulated dataset comprises:
a first signal from a first pulse having a first excitation flip angle and a first refocusing flip angle; and
a second signal from a second pulse having a second excitation flip angle and a second refocusing flip angle.

13. The magnetic resonance imaging system of claim 12, wherein the acquired dataset is generated according to a slice encoding for metal artifact correction (SEMAC) method.

14. The magnetic resonance imaging system of claim 12, wherein the computer code instructions, when executed by the at least one processor, cause the at least one processor to:
sample a first center of $k_y$-$k_z$ space for the first pulse; and
sample a second center of $k_y$-$k_z$ space for the second pulse.

15. The magnetic resonance imaging system of claim 12, wherein the scaling factor is a first scaling factor and the location is a first location, and wherein the computer code instructions, when executed by the at least one processor, cause the at least one processor to:
obtain a second scaling factor for a second location proximate the metallic object by minimizing the function of the acquired dataset and the simulated dataset.

16. The magnetic resonance imaging system of claim 12, wherein the simulated dataset comprises a third signal from a third pulse having a third excitation flip angle and a third refocusing flip angle.

17. The magnetic resonance imaging system of claim 12, wherein the metallic object is an implant.

18. The magnetic resonance imaging system of claim 12, wherein the acquired dataset is generated according to turbo-spin echo imaging.

* * * * *